United States Patent [19]

Mattfeld

[11] 3,758,871

[45] Sept. 11, 1973

[54] ARRANGEMENTS FOR CONTROLLING THE OUTPUT OF AMPLIFIERS

[75] Inventor: Johann Mattfeld, Kirchhausen, Germany

[73] Assignee: Licentia Patent - Verwaltungs - GmbH, Frankfurt am Main, Germany

[22] Filed: May 27, 1971

[21] Appl. No.: 147,536

[30] Foreign Application Priority Data

June 1, 1970 Germany .................. P 20 26 679.9

[52] U.S. Cl. ........................ 330/6, 330/29, 330/145

[51] Int. Cl. ........................................... H03g 3/30

[58] Field of Search ................ 330/6, 29, 144, 145; 307/309

[56] References Cited

UNITED STATES PATENTS 3,535,626 10/1970 Uemura et al. ................ 307/309 X 3,222,609 12/1965 Ulmer et al. ......................... 330/29

FOREIGN PATENTS OR APPLICATIONS 1,060,933 11/1953 France .............................. 330/144

OTHER PUBLICATIONS

Yhap et al., "Logical Device," IBM Technical Disclosure Bulletin, February 1960, pp. 59,60.

*Primary Examiner*—Roy Lake
*Assistant Examiner*—James B. Mullins
*Attorney*—Spencer & Kaye

[57] ABSTRACT

An arrangement for controlling the output of an amplifier in which an element determining the output value or gain factor comprises a semiconductor element with magnetic field dependent resistance and in which means are provided for producing a magnetic field which acts on the semiconductor element.

10 Claims, 6 Drawing Figures

*Inventor:*
Johann Mattfeld

BY Spencer & Kaye
ATTORNEYS.

ARRANGEMENTS FOR CONTROLLING THE OUTPUT OF AMPLIFIERS

BACKGROUND OF THE INVENTION

Variable resistors are frequently used for controlling the outputs of amplifiers. These may be the resistors of voltage dividers across which the input signal declines. However, a variable resistor may also be used for directly controlling the amplification factor of an amplifier stage if the resistor is mounted in the negative feedback or in the reactive feedback of the amplifier circuit. However, the use of such variable resistors or potentiometers is meaningful only if the potentiometer can be mounted physically near the other elements of the amplifier unit, because the leads carrying a.c. voltages are sensitive to feed-ins and must, therefore, be screened.

SUMMARY OF THE INVENTION

The primary object of the present invention is to overcome the above-mentioned disadvantage.

A further object of the invention is to provide an arrangement for controlling the output of an amplifier which comprises a semiconductor element with magnetic field dependent resistance for determining the output value or gain factor of the amplifier and means for producing a magnetic field acting on the semiconductor element.

Preferably the semiconductor element with magnetic field dependent resistance consists of a magnetic field diode.

With the arrangement according to the invention it is possible, for example, to vary the volume of an amplifier by means of leads carrying only direct current, thereby making possible an easy remote control of the circuit. Thus, in the arrangement of the invention, the limit frequency of the amplifier is not impaired by remote control leads carrying alternating current.

BRIEF DESCRIPTION OF THE DRAWINGS

The invention will now be further described, by way of example, with reference to the accompanying drawings, in which.

DESCRIPTION OF PREFERRED EMBODIMENTS

Figure 1:
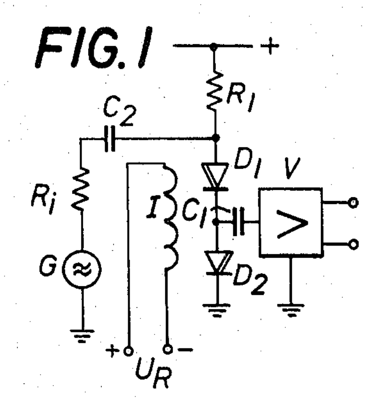
FIG. 1 shows an arrangement according to one embodiment of the present invention.

Reference will first be made to FIG. 1 of the drawings, in which a generator G supplying an a.c. signal is connected through an internal resistor $R_i$ and an isolating capacitor $C_2$ with a voltage divider. The part of the voltage declining across a resistor is amplified by an amplifier V in accordance with the gain factor associated with this amplifier. The magnitude of the input signal and, therefore, also the magnitude of the output signal of the amplifier V is thus governed primarily by the resistance of the a.c. resistor carrying the input signal. In the circuit shown in FIG. 1, this resistor is formed by a magnetic field diode $D_2$ connected through a series resistor $R_1$ so that with the supply d.c. voltage the diode $D_2$ is operated in the direction of flow.

A magnetic or magnetic field diode varies its ohmic resistance as a function of the magnetic flux passing through the diode. Magnetic field diodes have a zone of higher recombination probability of the charge carriers. If the charge carriers are pushed by the action of a magnetic field into the recombination zone, many of the injected charge carriers recombine and the ohmic resistance of the arrangement rises. If, on the other hand, the flux is deflected increasingly from the recombination zone by a magnetic field with reverse polarity, the recombination possibility of the injected charge carriers, and with it also the ohmic resistance of the whole arrangement, declines.

In the arrangement of FIG. 1, not only is a single diode used, but also a voltage divider of two series connected magnetic field diodes $D_1$ and $D_2$. Both diodes are polarised in the direction of flux. This circuit arrangement serves also for compensating the temperature, because half the input voltage drops across each diode irrespective of the prevailing temperature. In the case of the magnetic field diodes $D_1$ and $D_2$, represented symbolically in FIG. 1, a parallel line indicates that the zone of high recombination probability is located in both diodes on different sides of the semiconductor body. Thus, the ohmic resistance of one diode increases and that of the other diode decreases, if the same magnetic field acts on both. The resulting potential change on the diode $D_2$ causes a corresponding change of the output signal of the amplifier V. FIG. 1 shows an inductance I, connected through remote lines to a variable d.c. source. The magnetic field issuing from the inductance acts on both diodes $D_1$ and $D_2$. The magnetic field diodes are, for example, isolated from the amplifier by an isolating capacitor $C_1$ on the d.c. side.

Figure 2:
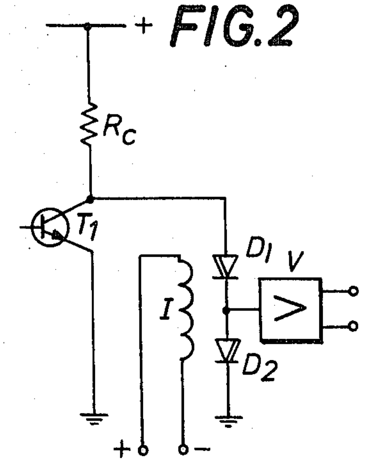
FIG. 2 shows a second embodiment of the arrangement according to the invention.

In the circuit shown in FIG. 2, the magnetic field diode, or the series circuit of both magnetic field diodes $D_1$ and $D_2$ is connected galvanically to the output of a transistor pre-stage. In this case, the same d.c. voltage source may be used for the d.c. supply of both diodes and of the transistor $T_1$. A collector resistor $R_c$ then carries the sum of the currents of the magnetic field diodes and the collector current $I_c$ of transistor $T_1$. The voltage divider of the two diodes $D_1$ and $D_2$ may, as shown in FIG. 2, also be coupled galvanically with the amplifier V. In this instance, the magnetic field diode $D_2$ has a temperature stabilizing action, because the temperature curve of the magnetic field diode corresponds largely to that of the amplifier transistors.

The magnetic field diodes may be connected in parallel or in series with inductances or capacitances. In this manner, the frequency response of the amplifier may be controlled. In addition, in this manner, a frequency curve of the output signal is obtained which is a function of the voltage division selected at the magnetic field diodes.

Figure 3A:
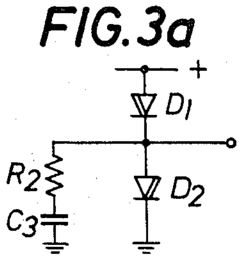
FIGS.3*a* and 3*b* show modifications of parts of the arrangement shown in FIG. 2.

FIG. 3*a* shows a first circuit of this kind. Connected in parallel to the magnetic field diode $D_2$, the voltage drop of which is applied to the amplifier V, is a series circuit of a resistor $R_2$ and a capacitor $C_3$. With increasing frequency, the capacitor $C_3$ acts increasingly as a short circuit so that the resistor $R_2$ of definite value is located in parallel to the diode $D_2$. Thus,at high frequencies, the gain is reduced to a definite value.

Figure 3B:
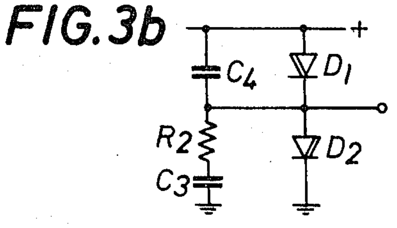
Figure 5:
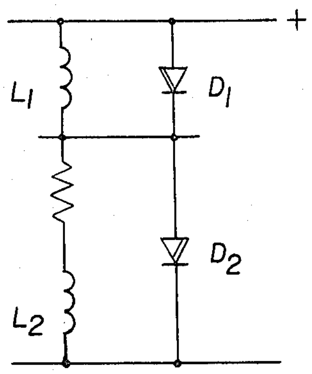
FIG. 5 shows an input circuit similar to FIG. 3*b* but using inductances rather than capacitances.

FIG. 3*b* shows a circuit, corresponding to that of FIG. 3*a* with the exception that here a further capacitor $C_4$ is connected in parallel with the diode $D_1$. In this manner, with high frequencies, the diode $D_1$ is short circuited more strongly than the diode $D_2$. The gain characteristic as a function of the frequency has therefore a minimum at a certain frequency, and increases with higher and with lower frequencies up to definite maximum values. A similar circuit using inductances is shown in FIG. 5.

Further possibilities of gain control by means of magnetic diodes are also possible. Thus, an automatic gain control may be achieved if one part of the output a.c. voltage is rectified at the amplifier V and applied to the inductance I for producing a magnetic field. In this manner it is possible that, with a large output signal, the resistance of the diode $D_2$ is reduced compared with that of the diode $D_1$ and the output signal is therefore also reduced. This prevents the amplifier from being overdriven.

In many cases, amplifier stages have a reactive circuit, consisting usually of a capacitor and a resistor. Also this resistor can be replaced in accordance with the invention by a magnetic field diode, the resistance of which may be controlled by a magnetic field.

The gain of a transistor amplifier depends to a not inconsiderable degree on the value of the negative feedback resistance in the emitter feed of an amplifier transistor. For this reason, in a preferred embodiment of the arrangement of the invention, this negative feedback resistance or a part of the negative feedback resistance may be replaced by a magnetic field diode. Such a circuit is shown in FIG. 4.

Figure 4:
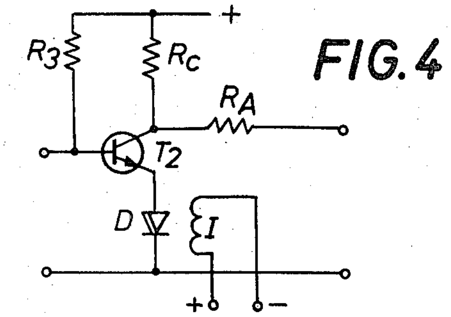
FIG. 4 is a detail of a further arrangement according to the invention.

FIG. 4 shows an amplifier stage of a transistor $T_2$, the input d.c. voltage of which is determined by a series resistor. The emitter resistance is formed by a magnetic field diode D, operated in the "through" direction and the resistance value of which may be varied by a magnetic field formed by an inductance I. In addition, the circuit also shows a collector resistor $R_c$ and an output resistor $R_A$. By varying the resistance of the magnetic field diode D, the gain factor of the amplifier stage is varied.

Naturally, the circuit arrangement according to the invention may be mounted in integrated form in one or a few semiconductor elements.

Further embodiments and modifications are envisaged without departing from the spirit and scope of the invention as defined in the appended claims.

We claim:

1. A circuit arrangement comprising, in combination: an amplifier having signal output means and signal input means, said signal input means including a pair of signal input terminals; a first magnetic field diode, having a resistance characteristic which varies in accordance with the direction and intensity of an applied magnetic field, coupled across said pair of signal input terminals; a second magnetic field diode, having a resistance characteristic which varies in accordance with the direction and intensity of an applied magnetic field, connected in series with said first magnetic field diode, said second magnetic field diode being so positioned that a change in magnetic field acting on both said diodes produces an increase in ohmic resistance in one of said diodes and a decrease in ohmic resistance in the other of said diodes, the series circuit of said first and second diodes constituting a voltage divider for the input signal to said amplifier; circuit means, including a reactance connected in parallel with said first magnetic field diode, for controlling the frequency response of said circuit arrangement; and means for producing a magnetic field which acts upon both said magnetic field diodes whereby the output signal magnitude and the gain of the circuit arrangement is determined by the direction and intensity of the magnetic field.

2. An arrangement as claimed in claim 1 wherein said circuit means further includes a resistor connected in series with said reactance with said series connection of said reactance and said resistor being connected in parallel with said first magnetic field diode.

3. An arrangement as claimed in claim 2 wherein said reactance is a capacitor.

4. An arrangement as claimed in claim 1 wherein said reactance is a capacitor.

5. An arrangement as claimed in claim 1 wherein said circuit means further includes a further reactance connected in parallel with said second magnetic field diode.

6. An arrangement as claimed in claim 5 wherein both said reactances are capacitors.

7. An arrangement as claimed in claim 5 wherein both said reactances are inductances.

8. An arrangement as claimed in claim 5 wherein said circuit means further includes a resistor connected in series with said reactance, with said series connection of said reactance and said resistor being connected in parallel with said first magnetic field diode.

9. An arrangement as claimed in claim 1 further comprising a direct current blocking capacitor connected between one output terminal of said magnetic field diode voltage divider and one of said signal input terminals of said amplifier.

10. An arrangement as claimed in claim 1 further comprising a transistor pre-stage the output of which is connected galvanically to said magnetic field diode voltage divider and a common voltage source arranged to provide a d.c. supply to said transistor and to said magnetic field diode voltage divider.

* * * * *